United States Patent
Doyle et al.

(10) Patent No.: US 8,817,250 B2
(45) Date of Patent: Aug. 26, 2014

(54) AIR BEARING FOR SUBSTRATE INSPECTION DEVICE

(75) Inventors: Paul Doyle, San Jose, CA (US); Guoheng Zhao, Milpitas, CA (US); Alexander Belyaev, Campbell, CA (US); J. Rex Runyon, Fremont, CA (US); Carmela C. Moreno, legal representative, Fremont, CA (US); Christian H. Wolters, San Jose, CA (US); Howard W. Dando, Aptos, CA (US); Mehdi Vaez-Iravani, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 83 days.

(21) Appl. No.: 13/226,032

(22) Filed: Sep. 6, 2011

(65) Prior Publication Data

US 2012/0062877 A1      Mar. 15, 2012

Related U.S. Application Data

(63) Continuation of application No. 12/994,793, filed as application No. PCT/US2009/045704 on May 29, 2009, now abandoned.

(60) Provisional application No. 61/059,861, filed on Jun. 9, 2008.

(51) Int. Cl.
*G01N 21/00*      (2006.01)

(52) U.S. Cl.
USPC ........................................ 356/237.5

(58) Field of Classification Search
USPC ............................... 356/237.2–237.6
See application file for complete search history.

(56) References Cited

U.S. PATENT DOCUMENTS

| | | | |
|---|---|---|---|
| 7,530,778 B2 | 5/2009 | Yassour |
| 7,812,925 B2 | 10/2010 | Ebihara |
| 2004/0207838 A1 | 10/2004 | Ebert |
| 2006/0060259 A1 | 3/2006 | Devitt |
| 2006/0219605 A1 | 10/2006 | Devitt |
| 2008/0174771 A1 | 7/2008 | Yan |
| 2008/0229811 A1 | 9/2008 | Zhao |

FOREIGN PATENT DOCUMENTS

| | | |
|---|---|---|
| JP | 08-220769 A | 8/1996 |
| JP | 2000-223388 A | 8/2000 |
| KR | 10-2005-0008231 A | 1/2005 |
| KR | 10-2008-0010650 A | 1/2008 |

*Primary Examiner* — Gregory J Toatley
*Assistant Examiner* — Rebecca C Bryant
(74) *Attorney, Agent, or Firm* — Luedeka Neely Group, P.C.; Rick Barnes

(57) ABSTRACT

A tool for investigating a substrate, where the tool has a tool head for investigating the substrate, a chuck for disposing an upper surface of the substrate in proximity to the tool head, and an air bearing disposed on the tool head adjacent the substrate. The air bearing has a pressure source and a vacuum source, where the vacuum source draws the substrate toward the air bearing and the pressure source prevents the substrate from physically contacting the air bearing. The pressure source and the vacuum source work in cooperation to dispose the upper surface of the substrate at a known distance from the tool head. By using the air bearing as part of the tool in this manner, registration of the substrate to the tool head is accomplished relative to the upper surface of the substrate, not the back side of the substrate.

19 Claims, 6 Drawing Sheets

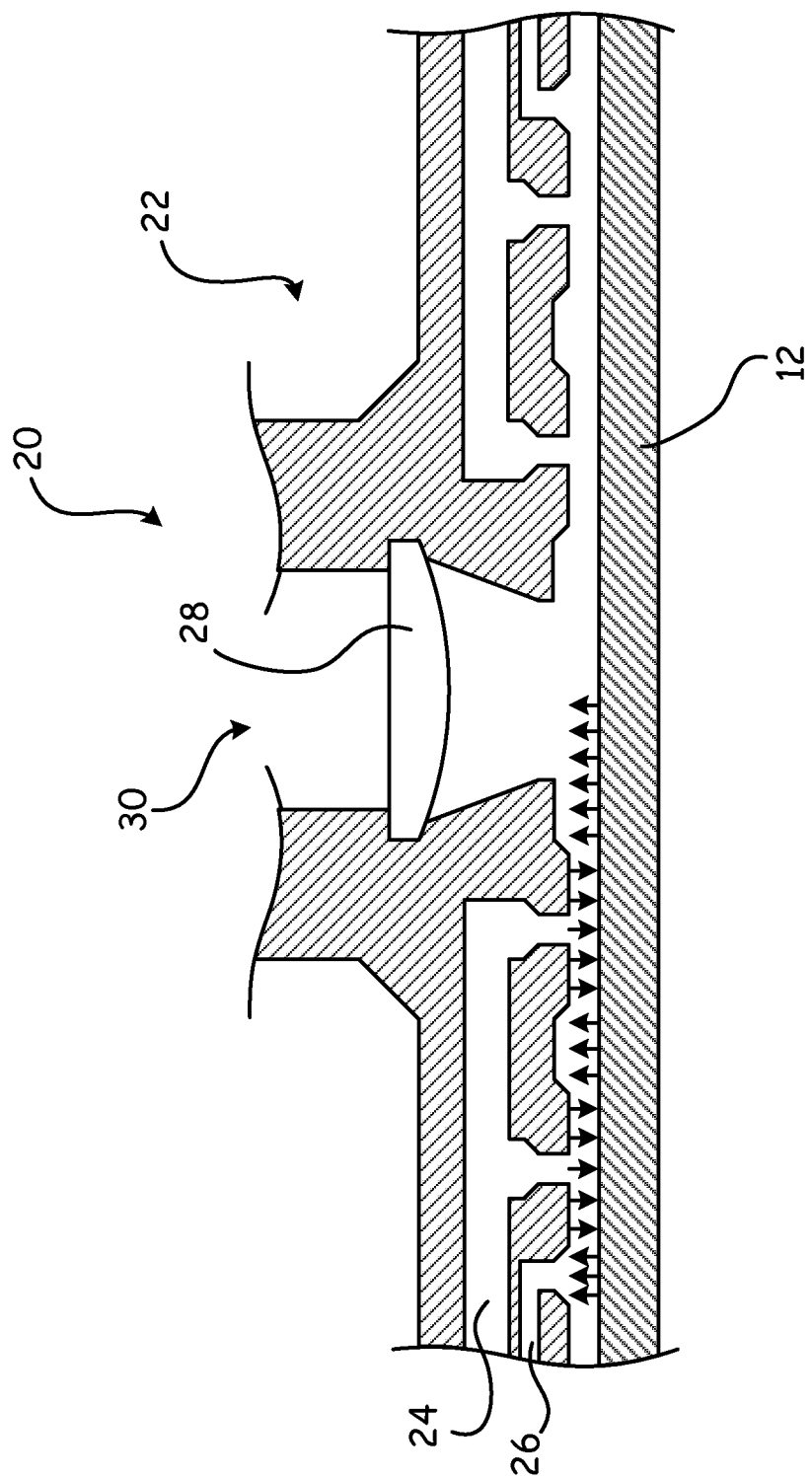

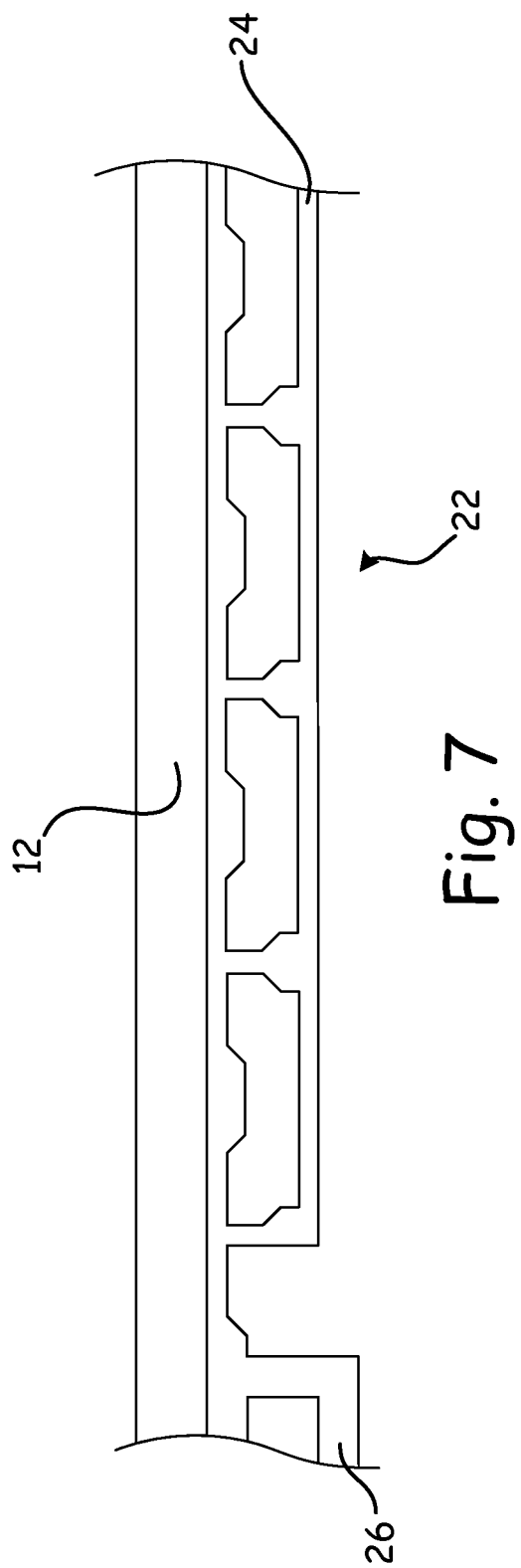

AIR BEARING FOR SUBSTRATE INSPECTION DEVICE

FIELD

This application is a continuation of prior pending U.S. patent application Ser. No. 12/994,793 filed Nov. 26, 2010, and further claims all rights and priority on U.S. provisional application Ser. No. 61/059,861 filed Jun. 9, 2008. and PCT application serial number PCT/US2009/045704 filed May 29, 2009. This invention relates to the field of integrated circuit fabrication. More particularly, this invention relates to registration of tool heads to substrate surfaces.

BACKGROUND

During integrated circuit fabrication processes, the integrated circuits typically receive a variety of different surface inspections and measurements, such as optical inspections and measurement. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

The term "tool" as used herein generally refers to inspection or measurement systems used in the integrated circuit fabrication industry. The term "investigation" as used herein generally refers to the process of inspection or measurement as used in the integrated circuit fabrication industry. As used herein, the term "substrate" refers to the substrates on which the integrated circuits are fabricated, the masks or reticles from which the patterns used to form the integrated circuits are transferred, and other types of substrates as used in the integrated circuit fabrication industry.

Current methods of investigation typically reference the backside of the substrate to a chuck while inspecting the front side of the substrate. In other words, the backside of the substrate is placed on the surface of a chuck, which is then brought into some kind of alignment with the operative head of the tool. The tool is most frequently designed to investigate the top surface of the substrate. Assumptions are made in the operation of the tool, such as that the chuck is flat and moves in a level manner, that the substrate is of a known and uniform thickness, and other such. These assumptions are used to align the head of the tool to the top surface of the substrate, when the position of the chuck is known.

This method is vulnerable to inconsistencies in the flatness of the chuck, variances in substrate geometry that affect the height of the substrate, and other problems that make the assumptions invalid. For example, if the substrate thickness varies from what is assumed, then the distance between the head and the top surface of the substrate will vary across the substrate—unbeknownst to the tool. Similarly, if the chuck height varies from what is assumed, then the distance between the head and the top surface of the substrate will vary across the chuck—unbeknownst to the tool.

This situation is typically resolved by using an active focusing mechanism to compensate for height changes as the substrate is moved with respect to the tool head. A typical auto-focus mechanism, including a control system, can cost thousands of dollars to implement, and many times that to engineer, especially when considering software development costs. History has proven that these are problematic mechanisms when implemented with the accuracy and repeatability that are expected by the customer. As customers demand faster through-put, the auto-focus mechanism needs to respond faster as well. Because they are mechanical in nature, these mechanisms have limited response times, which often are not sufficient to meet the through-put demanded. Some inspection systems have such large optical elements that moving them to track height variations at a high speed is just not a realistic option.

What is needed, therefore, is a system that overcomes problems such as those described above, at least in part.

SUMMARY

The above and other needs are met by a tool for investigating a substrate, where the tool has a tool head for investigating the substrate, a chuck for disposing an upper surface of the substrate in proximity to the tool head, and an air bearing disposed on the tool head adjacent the substrate. The air bearing has a pressure source and a vacuum source, where the vacuum source draws the substrate toward the air bearing and the pressure source prevents the substrate from physically contacting the air bearing. The pressure source and the vacuum source work in cooperation to dispose the upper surface of the substrate at a known distance from the tool head.

By using the air bearing as part of the tool in this manner, registration of the substrate to the tool head is accomplished relative to the upper surface of the substrate, not the back side of the substrate. Because it is the upper surface of the substrate that will be investigated, the registration is more accurate and does not rely on the assumptions made above. However, the substrate is not damaged by the tool head, because the air bearing prevents physical contact between the air bearing or the tool head and the upper surface of the substrate.

In various embodiments, the tool is an integrated circuit inspection tool or an integrated circuit measurement tool. In some embodiments the tool performs optical-based investigations of the substrate, and in some embodiments the tool performs electrical-based investigations of the substrate. The substrate in various embodiments is a semiconductor substrate with integrated circuits at least partially formed thereon, or a mask with integrated circuit patterns formed thereon.

In some embodiments the air bearing is formed of a porous material through which the pressure source is delivered, where the porous material forms annular channels through which the vacuum source is delivered. In other embodiments the air bearing is formed of a porous material through which the pressure source is delivered, where the porous material forms substantially evenly spaced voids through which the vacuum source is delivered. In some embodiments the air bearing is formed of a non-porous material that forms first channels through which the pressure source is delivered, and second channels through which the vacuum source is delivered.

In some embodiments the tool head investigates the substrate through an orifice formed in a central location of the air bearing, and in other embodiments the orifice is formed in a peripheral location of the air bearing. In some embodiments retention pieces on the chuck substantially retain the substrate at desired positions within an x-y plane adjacent the air bearing, while allowing the air bearing to adjust the desired positions of the substrate in a z axis to the known distance from the tool head. In some embodiments the chuck imparts translational, rotational, and elevational movement to the substrate relative to the tool head.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 2 is a cross sectional depiction of a tool head and air bearing according to an embodiment of the present invention.

FIG. 7 is a cross sectional depiction of an air bearing according to a sixth embodiment of the present invention.

DETAILED DESCRIPTION

Figure 1:
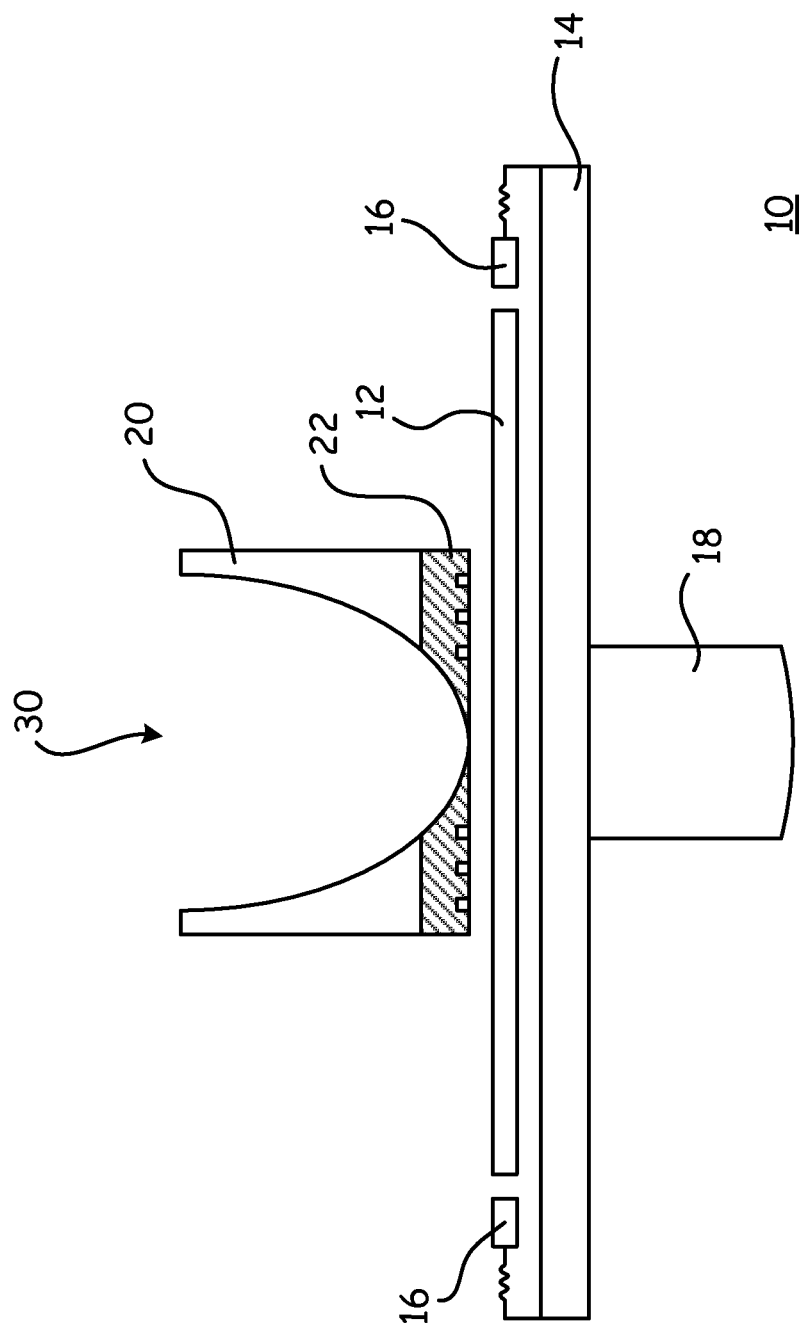
FIG. 1 is a cross sectional depiction of a tool according to an embodiment of the present invention.

With reference now to FIG. 1, there is depicted a tool 10, including a tool head 20, chuck 14 and spindle 18. A substrate 12 is disposed on the chuck 14, and is brought via relative motion to be under the tool head 20. A vacuum preloaded air bearing 22 at the end of the tool head 20 is used to reference the top side of the substrate 12. The chuck 14 includes movable substrate 12 retention pieces 16, which allow the substrate 12 to move up and down to some extent, so that the vertical registration of the substrate 12 with reference to the tool head 20 is accomplished to a fine degree with the air bearing 22, and only to a gross degree with the chuck 14. In other words, the chuck 14 brings the substrate 12 adjacent the head 20, and the air bearing 22 adjusts the vertical distance of the upper surface of the substrate 12 to the tool head 20. The retention pieces 16 in one embodiment hold the substrate 12 substantially fixed in rotation and translation, but not in elevation.

The air bearing 22 in one embodiment is attached directly to the tool head 20, such as a microscope objective 28 within a tool head orifice 30, as depicted in FIG. 2, and the substrate 12 to be inspected is then brought to the tool head 20. Once the substrate 12 is brought close enough to the air bearing 22, a vacuum provided along vacuum source 26 pulls the substrate 12 closer to the head 20 while a pressure provided along pressure source 24 pushes the substrate 12 away, until the distance between the substrate 12 and the air bearing 22 creates an equilibrium condition with respect to the vacuum 26 and the pressure 24.

In this manner, the substrate 12 is held in a very precise vertical position regardless of the geometry of the substrate 12, because the upper surface of the substrate 12 is mechanically referenced to the tool head 20. Because the air bearing 22 applies a pressure force that increases as the gap decreases between the substrate 12 and the air bearing 22, there is only a very low probability of the substrate 12 ever actually contacting the air bearing 22, and damaging the surface of the substrate 12. Thus, this method of referencing the surface of the substrate 12 is essentially a non contact method. Further, filtering the gas in the pressure source 24 makes this method substantially compatible with highly contamination sensitive applications.

The air bearing 22 in some embodiments forms a substantially hermetic seal between the tool head orifice 30 formed in the air bearing 22 and an environment exterior to the air bearing 22. This enables a vacuum to be drawn within the tool head orifice 30, such as would be used for certain types of tools 10, such as an electron microscope. The air bearing 22 in some embodiments forms a contamination barrier between the tool head orifice 30 formed in the air bearing 22, and an environment exterior to the air bearing 22. In this manner, contaminants—such as particulate or vapor contamination—will not interfere with the proper operation of the tool 10.

Figure 4:
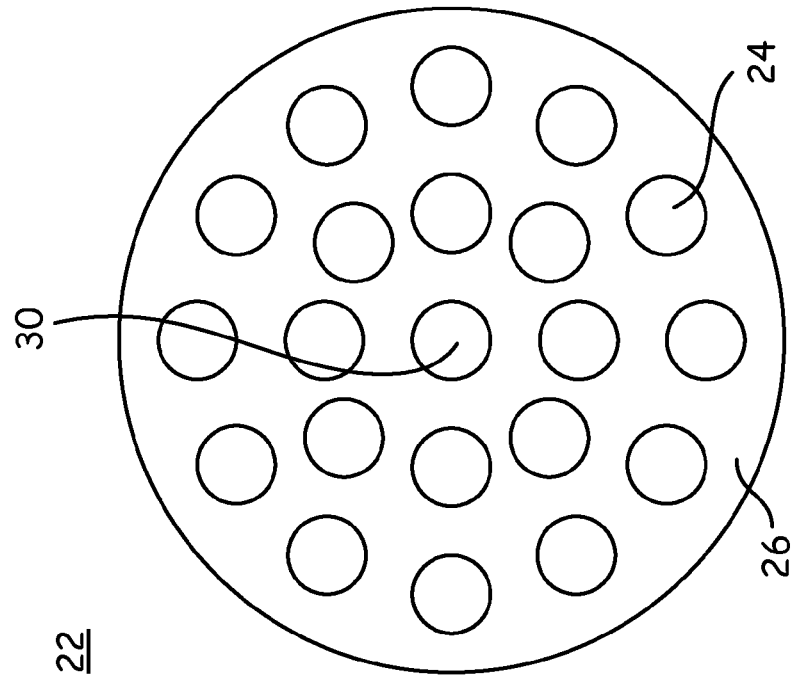
FIG. 4 is a cross sectional depiction of an air bearing according to a second embodiment of the present invention.
Figure 3:
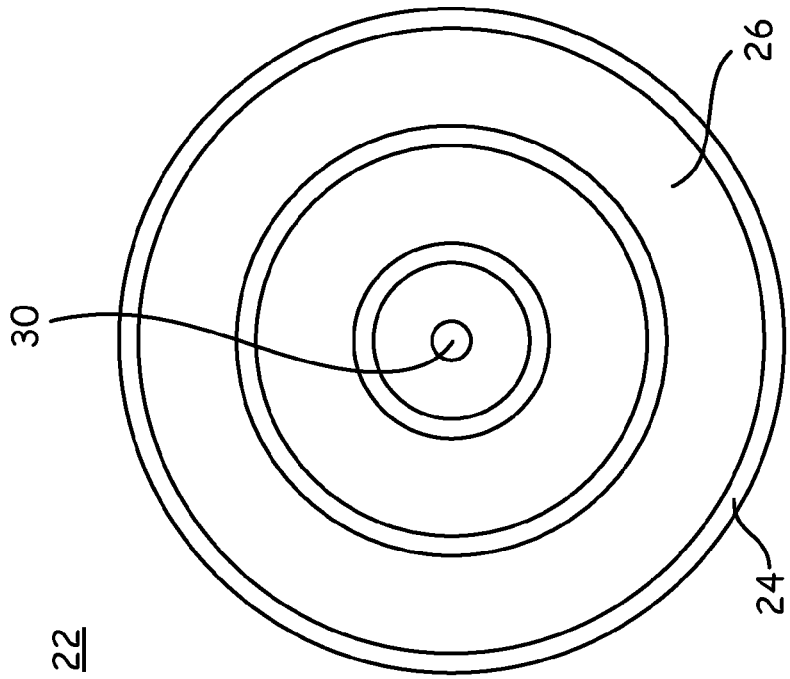
FIG. 3 is a cross sectional depiction of an air bearing according to a first embodiment of the present invention.

Different configurations of the air bearing 22 are depicted in FIGS. 3-6. In FIG. 3, the air bearing 22 has annular vacuum sources 26 disposed within a porous media in which the pressure sources 24 are formed, with the tool head orifice 30 disposed in the center of the air bearing 22. FIG. 4 depicts another embodiment of the air bearing 22, where the pressure sources 24 are disposed within a porous media in which the vacuum sources 26 are disposed. A tool head orifice 30 is centrally disposed in this embodiment as well.

In the embodiments depicted, it is appreciated that the pressure sources 24 and the vacuum sources 26 could be switched as to any of the specific configurations. Alternately, in some embodiments some of the openings in the block material of the air bearing 22 are pressure sources 24 and some of the openings are vacuum sources 26.

Figure 6:
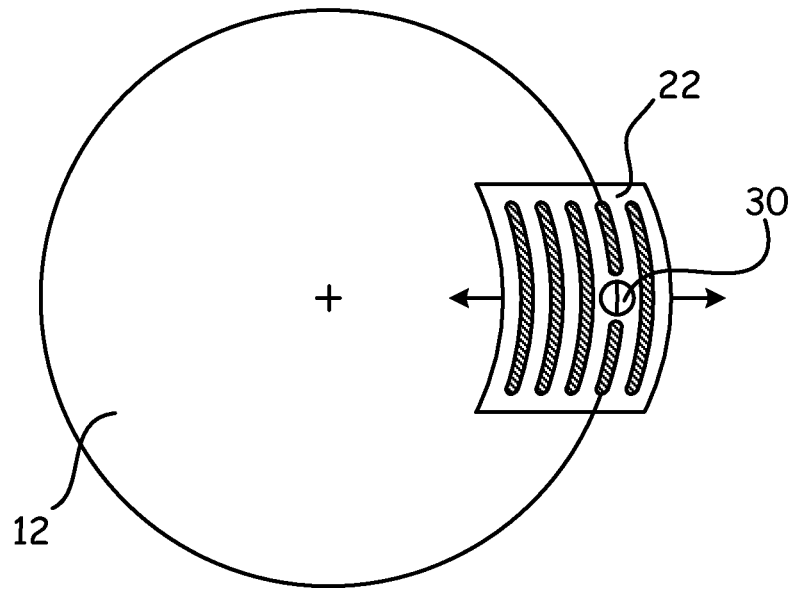
FIG. 6 is a cross sectional depiction of an air bearing according to a fifth embodiment of the present invention.
Figure 5:
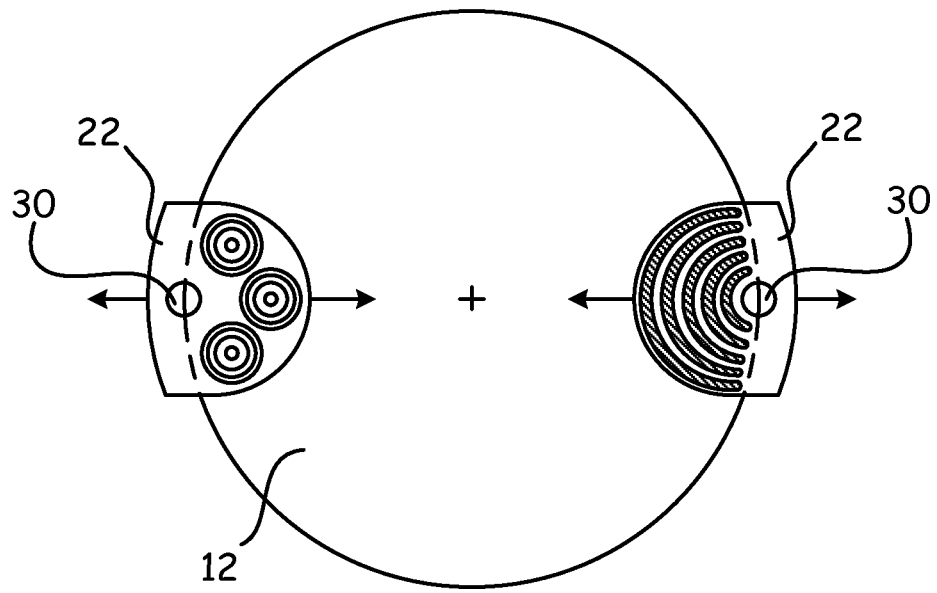
FIG. 5 is a cross sectional depiction of air bearings according to a third and fourth embodiment of the present invention.
Figure 8:
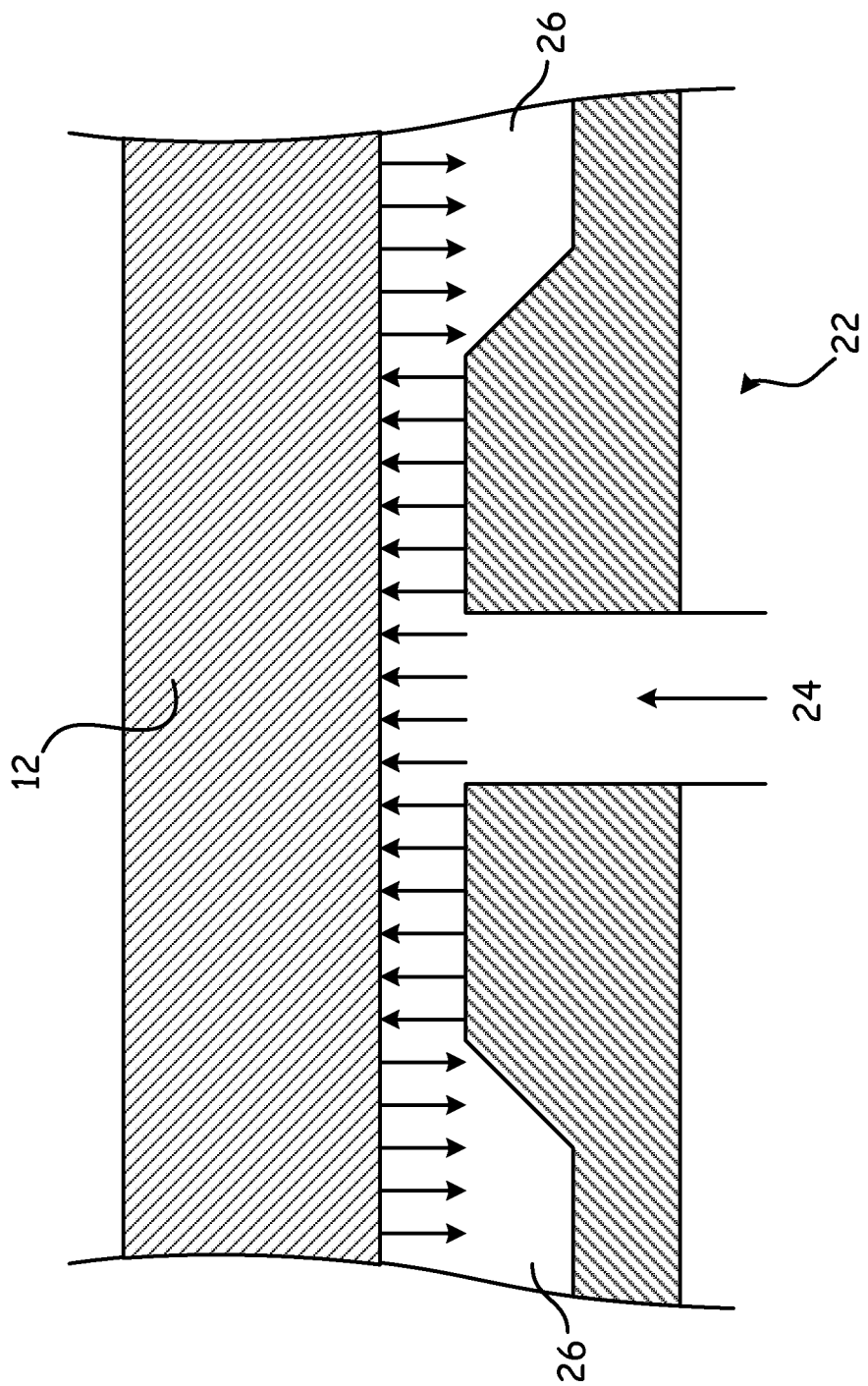
FIG. 8 is a cross sectional depiction of an air bearing according to a seventh embodiment of the present invention.

With reference now to FIGS. 5 and 6, there are depicted some alternate embodiments of the air bearing 22, where the tool head orifice 30 is not disposed in the center of the air bearing 22. FIGS. 7-8 provide some detail as to other embodiments of a configuration of the pressure source 24 and the vacuum source 26.

Similar methods could be performed with alternate air bearing 22 technologies, which utilize either porous media or orifices, as described above. In one embodiment an electrostatic chuck with alternating charge areas is used in vacuum environments. In yet another embodiment, magnetic levitation is used in a non contact manner of registering the substrate 12 to the tool head 20.

The embodiments as described above can be used for substrate 12 inspection and measurement tools. As the industry demands finer and finer resolution, it is a reality that depth of field gets smaller and smaller. This requires extremely flat chucks 14 to hold the substrates 12 and extremely precise mechanisms to transport them under the tool head 20 at a precisely controlled height. The mechanisms described herein can be attached directly to a tool head 20, thereby reducing the precision necessary in the chuck 14 and transport mechanism 18, while eliminating the costly auto focus mechanisms that would otherwise be required to compensate for substrate 12 and chuck 14 thickness and geometry variations.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A tool for investigating a substrate, the tool comprising:
   a tool head for investigating the substrate,
   a chuck for disposing an upper surface of the substrate in proximity to the tool head, and
   an air bearing disposed on the tool head adjacent the substrate, the air bearing having a pressure source and a vacuum source, the vacuum source for drawing the substrate toward the air bearing and the pressure source for preventing the substrate from physically contacting the air bearing, where the pressure source and the vacuum source work in cooperation to dispose the upper surface of the substrate at a known distance from the tool head,
   wherein the air bearing forms a substantially hermetic seal with the upper surface of the substrate between an interior orifice formed in the air bearing and an environment exterior to the air bearing.

2. The tool of claim 1, wherein the air bearing forms a contamination barrier between an interior orifice formed in the air bearing and an environment exterior to the air bearing.

3. The tool of claim 1, wherein the tool is an integrated circuit inspection tool.

4. The tool of claim 1, wherein the tool is an integrated circuit measurement tool.

5. The tool of claim 1, wherein the tool performs optical-based investigations of the substrate.

6. The tool of claim 1, wherein the tool performs electrical-based investigations of the substrate.

7. The tool of claim 1, wherein the substrate is a semiconductor substrate with integrated circuits at least partially formed thereon.

8. The tool of claim 1, wherein the substrate is a mask with integrated circuit patterns formed thereon.

9. The tool of claim 1, wherein the air bearing is formed of a porous material through which the pressure source is delivered, the porous material forming annular channels through which the vacuum source is delivered.

10. The tool of claim 1, wherein the air bearing is formed of a porous material through which the pressure source is delivered, the porous material forming substantially evenly spaced voids through which the vacuum source is delivered.

11. The tool of claim 1, wherein the air bearing is formed of a non-porous material that forms first channels through which the pressure source is delivered, and second channels through which the vacuum source is delivered.

12. The tool of claim 1, wherein the tool head investigates the substrate through an orifice formed in a central location of the air bearing.

13. The tool of claim 1, wherein the tool head investigates the substrate through an orifice formed in a peripheral location of the air bearing.

14. The tool of claim 1, further comprising retention pieces on the chuck for substantially retaining the substrate at desired positions within an x-y plane adjacent the air bearing, while allowing the air bearing to adjust the desired positions of the substrate in a z axis to the known distance from the tool head.

15. The tool of claim 1, wherein the chuck imparts translational, rotational, and elevational movement to the substrate relative to the tool head.

16. A tool for investigating a substrate, the tool comprising:
   a tool head for investigating the substrate,
   a chuck for disposing an upper surface of the substrate in proximity to the tool head,
   an air bearing disposed on the tool head adjacent the substrate, the air bearing having a pressure source and a vacuum source, the vacuum source for drawing the substrate toward the air bearing and the pressure source for preventing the substrate from physically contacting the air bearing, where the pressure source and the vacuum source work in cooperation to dispose the upper surface of the substrate at a known distance from the tool head, and
   retention pieces on the chuck for substantially retaining the substrate at desired positions within an x-y plane adjacent the air bearing, while allowing the air bearing to adjust the desired positions of the substrate in a z axis to the known distance from the tool head,
   wherein the air bearing forms a substantially hermetic seal with the upper surface of the substrate between an interior orifice formed in the air bearing and an environment exterior to the air bearing.

17. The tool of claim 16, wherein the tool is an integrated circuit inspection tool.

18. The tool of claim 16, wherein the tool is an integrated circuit measurement tool.

19. An optical inspection tool for inspecting a substrate, the tool comprising:
   an optical tool head for inspecting the substrate,
   a chuck for disposing an upper surface of the substrate in proximity to the tool head, wherein the chuck imparts translational, rotational, and elevational movement to the substrate relative to the tool head,
   an air bearing disposed on the tool head adjacent the substrate, the air bearing having a pressure source and a vacuum source, the vacuum source for drawing the substrate toward the air bearing and the pressure source for preventing the substrate from physically contacting the air bearing, where the pressure source and the vacuum source work in cooperation to dispose the upper surface of the substrate at a known distance from the tool head, wherein the air bearing is formed of a porous material through which the pressure source is delivered, the porous material forming annular channels through which the vacuum source is delivered, and
   retention pieces on the chuck for substantially retaining the substrate at desired positions within an x-y plane adjacent the air bearing, while allowing the air bearing to adjust the desired positions of the substrate in a z axis to the known distance from the tool head,
   wherein the air bearing forms a substantially hermetic seal with the upper surface of the substrate between an interior orifice formed in the air bearing and an environment exterior to the air bearing.

* * * * *